(12) United States Patent
Tanoue et al.

(10) Patent No.: US 6,203,617 B1
(45) Date of Patent: Mar. 20, 2001

(54) CONVEYING UNIT AND SUBSTRATE PROCESSING UNIT

(75) Inventors: Shinya Tanoue; Shinichiro Araki, both of Kikuchi-gun; Tatsuya Iwasaki; Eiichiro Kamada, both of Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/272,315

(22) Filed: Mar. 19, 1999

(30) Foreign Application Priority Data

Mar. 26, 1998 (JP) ................................. 10-079582

(51) Int. Cl.[7] ..................................................... B05C 11/00
(52) U.S. Cl. .................. 118/695; 118/696; 118/320; 118/500; 118/503; 414/416; 414/937
(58) Field of Search .................... 118/675, 686, 118/712, 7 B, 500, 503, 52, 56, 320, 663, 695, 696, 58, 676, 679; 414/222.02, 938, 225.01, 226.04, 935, 936, 937, 416; 700/121, 218, 228

(56) References Cited

U.S. PATENT DOCUMENTS 5,206,627 * 4/1993 Kato ...................................... 340/674
5,700,127 * 12/1997 Harada et al. ........................ 414/416
5,980,591 * 11/1999 Akimoto et al. .................... 29/25.01

FOREIGN PATENT DOCUMENTS 2-164050    6/1990  (JP) .

\* cited by examiner

*Primary Examiner*—Laura Edwards
(74) *Attorney, Agent, or Firm*—Rader, Fishman & Grauer

(57) ABSTRACT

The present invention is a conveying unit having a controller for detecting information corresponding to the thickness of each of a plurality of raw substrates, assigning desired identifiers to the raw substrates, storing the identifiers, and causing a conveyor to convey each of the raw substrates or controlling processing conditions for a plurality of processing chambers with the identifiers corresponding to the thickness of each of the raw substrates. Thus, even if one cassette accommodates a plurality of raw substrates, the conveyor can smoothly load the same type of raw substrates to the accommodating cassette and unload them therefrom in a simple structure. The controller sets desired processing conditions for each of the processing portions corresponding to the identifiers.

19 Claims, 16 Drawing Sheets

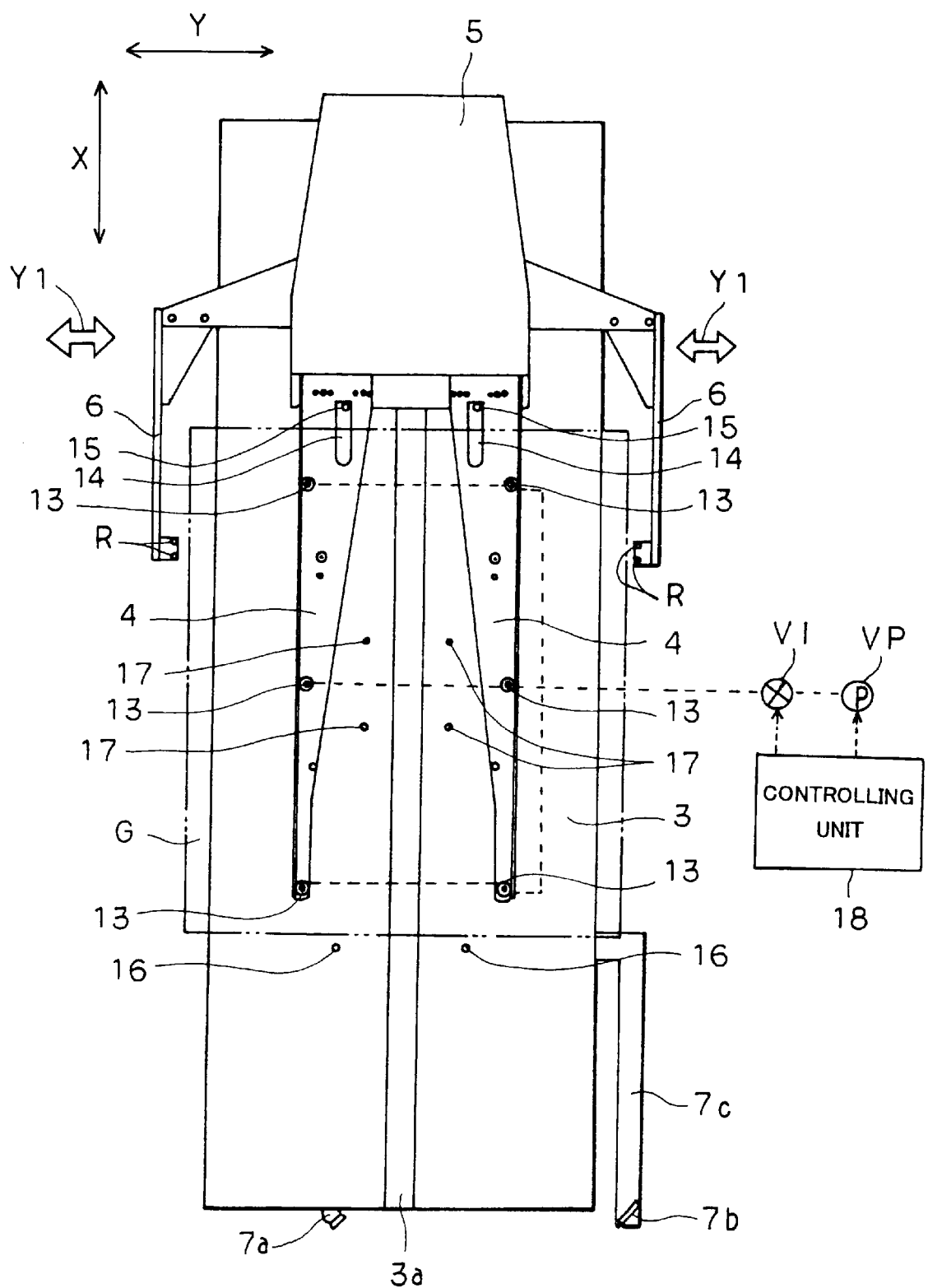
F I G. 6

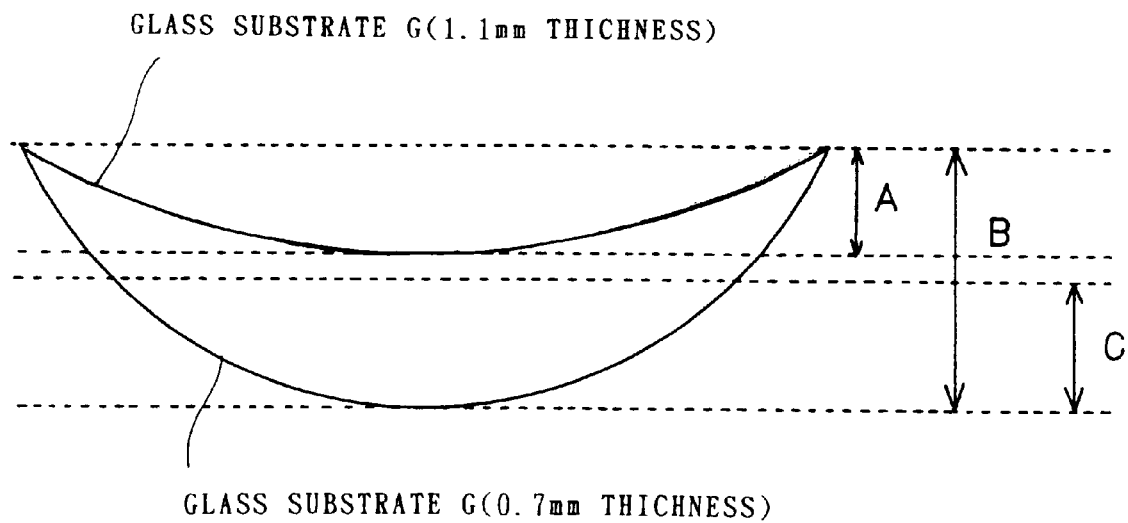
F I G. 8

CONVEYING UNIT AND SUBSTRATE PROCESSING UNIT

BACKGROUND OF THE INVENTION

1. Field of the Invention

The present invention relates to a substrate processing unit such as a coating and developing unit for performing a coating process and a developing process for a substrate such as a glass substrate. The present invention also relates to a conveying unit for use with such a substrate processing unit.

2. Description of the Related Art

In a unit that performs a coating process and a developing process for glass substrates used for liquid crystal displaying units (referred to as LCDS), the glass substrates are accommodated in a cubic or rectangular parallelopiped one-side opened accommodating cassette (referred to as carrier cassette) in such a manner that the glass substrates are horizontally arranged and kept in parallel. A conveying mechanism conveys a glass substrate from the carrier cassette to a coating unit or a developing unit.

FIG. 17 is a perspective view showing the relation between the conveying mechanism and the carrier cassette.

Referring to FIG. 17, a conveying mechanism 100 can be traveled in for example Y and Z directions and rotated in 2 direction. The traveling mechanism 100 has a pair of tweezers 101. The tweezers 101 can be traveled in X direction.

First, the conveying mechanism 100 is traveled. The conveying mechanism 100 is stopped in front of the carrier cassette C. The conveying mechanism 100 is traveled in Z direction so that the tweezers 101 are aligned to the height of a lower space of a relevant glass substrate G (see FIG. 17(1)). In this state, the tweezers 101 are inserted between the glass substrate G and a glass substrate G on the lower adjacent stage (see FIG. 17(2)).

Next, the tweezers 101 are upwardly traveled so as to pick up the glass substrate G (see FIG. 17(3)). The tweezers 101 that have picked up the glass substrate G are extracted from the carrier cassette C. Thus, the glass substrate G is extracted from the carrier cassette C (see FIG. 17(4)). The conveying mechanism 100 transfers the glass substrate G to a main arm (not shown) that conveys the glass substrate G to the next processing unit.

When such a coating and developing unit processes glass substrates G with different thickness, one carrier cassette accommodates glass substrates G with different thickness.

However, when the conveying mechanism 100 conveys glass substrates with different thickness to the carrier cassette C, the following problems may take place.

As a first problem, since the sizes of LCD glass substrates G are relatively large, the glass substrates G tend to flex. However, when the glass substrates G have different thickness, the flexure amounts thereof vary. Thus, corresponding to the thickness of the glass substrate G, the access position of the tweezers 101 should be designated. To do that, for example, a means that detects the thickness of each glass substrate G accommodated in the carrier cassette C is required.

As a second problem, before the unit is shipped, the tweezers 101 have been adjusted so that they are inserted into the center position of a space formed between two adjacent glass substrates G. However, when the unit is installed on site, the relation between the positions of the conveying mechanism 2 and the carrier cassette C deviates. Thus, after the unit has been installed, the access position should be corrected. However, when the glass substrates G have different thickness, the access position should be changed for each glass substrate G. Thus, the installing operation for the unit becomes complicated. In particular, since a conventional processing unit has a plurality of carrier cassettes C, the access position should be adjusted for each carrier cassette C and for each glass substrate G that has different thickness. Thus, the installing operation for the unit becomes complicated.

In addition, when one carrier cassette C accommodates glass substrates G with different thickness or when a carrier cassette C accommodating glass substrates C with different thickness is conveyed from the outside to the unit, the conveying position or the processing conditions of each processing portion in the unit should be changed. Since it takes a long maintenance time to change the access position, the yield of the unit deteriorates. In addition, if a processing condition is incorrectly set, a glass substrate G may collide with the casing of the unit or a carrier cassette C. Thus, the carrier cassette C may be damaged. Consequently, the yield of the unit deteriorates. If a processing condition in the processing portion is incorrectly set, due to the incorrect processing condition, the yield of the unit deteriorates.

SUMMARY OF THE INVENTION

The present invention is made from the above-described point of view. An object of the present invention is to provide a conveying unit that smoothly loads a raw substrate to an accommodating cassette and unloads a raw substrate therefrom in a simple structure even if the accommodating cassette accommodates different types of raw substrates. Another object of the present invention is to provide a substrate processing unit that sets processing conditions corresponding to the types of raw substrates.

A further object of the present invention is to provide a conveying unit whose teaching operation and installation operation are simplified even if one accommodating cassette accommodates different types of raw substrates.

A first aspect of the present invention is a conveying unit, comprising a cassette stock portion for stocking a plurality of accommodating cassettes, each of the accommodating cassettes horizontally accommodating a plurality of raw substrates, a conveying mechanism for horizontally loading and unloading each of the raw substrates to and from one of the accommodating cassettes, and a controlling mechanism for separating the plurality of raw substrates into a plurality of groups corresponding to the thickness of the raw substrates, assigning identifiers to the raw substrates corresponding to the groups, and causing the conveying mechanism to convey each of the raw substrates corresponding to the identifiers or controlling the vertical traveling amount of each of the accommodating cassettes. Thus, without need to use a means for detecting the thickness of each of raw substrates accommodated in an accommodating cassette, each of the raw substrates can be smoothly loaded to the accommodating cassette and unloaded therefrom in a simple structure. In addition, since what raw substrate has been loaded to what processing chamber and unloaded from what processing chamber corresponding to an assigned identifier, processing conditions for a processing portion can be easily set for each of raw substrates. Thus, the yield of the unit can be improved.

A second aspect of the present invention is a conveying unit, comprising a cassette stock portion for stocking an accommodating cassette, the accommodating cassette horizontally accommodating a plurality of types of raw substrates, a conveying mechanism for horizontally loading and unloading each of the raw substrates to and from the accommodating cassette, a storing means for storing the relative relation of loading/unloading positions of the plurality of types of the raw materials, a setting means for setting the loading/unloading position of at least one type of the raw substrates, a determining means for determining the loading/unloading position of other types of the raw substrates corresponding to the relation of the relative positions and the loading/unloading position that has been set by the setting means, and a controlling mechanism for causing the conveying mechanism to convey each of the raw substrates or controlling the vertical traveling amount of the accommodating cassette corresponding to the set results of the setting means and the determined results of the determining means. Since the access positions of raw substrates other than those whose access positions have been set and stored are determined corresponding to the relation of the access positions of the raw substrates that have been set and stored, when the unit is installed, the teaching operation can be simplified. Thus, the installing operation can be simplified.

A third aspect of the present invention is a conveying unit, comprising a cassette stock portion for stocking an accommodating cassette, the accommodating cassette horizontally accommodating a plurality of types of raw substrates, a conveying mechanism for horizontally loading and unloading each of the raw substrates to and from the accommodating cassette, a calculating means for calculating the flexure amount of each type of the raw substrates accommodated in the accommodating cassette, a determining means for determining the loading/unloading position of each type of the raw substrates corresponding to the calculated results of the calculating means, and a controlling mechanism for causing the conveying means to convey each of the raw substrates or controlling the vertical traveling amount of the accommodating cassette corresponding to the determined results of the determining means. Thus, it is not necessary need to set the conveying position and to set various processing conditions for each processing portion of the unit. Alternatively, the processing conditions can be easily simplified. Consequently, the maintenance time for setting the processing conditions can be shortened or omitted. Thus, the yield of the unit can be improved. In addition, the processing conditions of the processing portion corresponding to the thickness of a raw substrate can be quickly changed or handled. Thus, a process can be performed with desired processing conditions. Thus, the yield of the process can be easily improved.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 6 is a plan view showing the structure of the conveying unit according to the embodiment of the present invention;

FIG. 8 is a schematic diagram for explaining a method for calculating an access position of the conveying unit according to the embodiment of the present invention;

DETAILED DESCRIPTION OF THE PREFERRED EMBODIMENTS

Next, with reference to the accompanying drawings, preferred embodiments of the present invention will be described.

Figure 1:
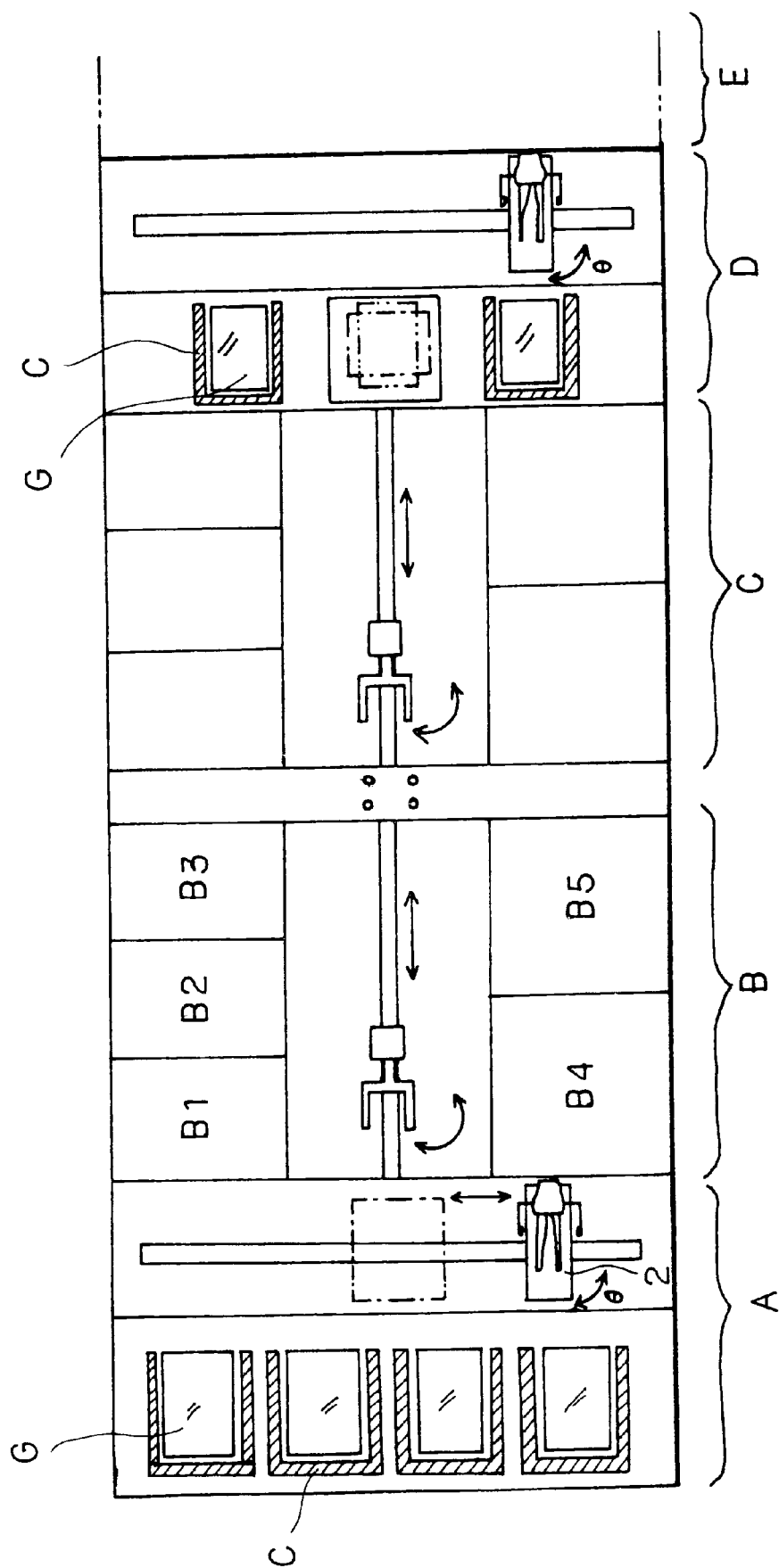
FIG. 1 is a plan view showing the overall structure of a processing unit including a conveying unit according to an embodiment of the present invention.

FIG. 1 is a plan view showing the structure of a coating and developing unit as a substrate processing unit according to an embodiment of the present invention. The coating and developing unit performs a coating process and a developing process for LCD glass substrates.

The coating and developing unit comprises a loading/unloading unit A, a first processing unit B, a second processing unit C, and an interface portion D. The loading/unloading unit A is a loading/unloading port that loads and unloads a glass substrate as a raw substrate. The first processing unit B has a plurality of processing portions that coat resist solution to a glass substrate and forms a resist film on the glass substrate. The second processing unit has a plurality of processing portions that perform an exposing process and develop a resist film on a substrate.

For example, an exposing unit E is disposed adjacent to the interface portion D. A glass substrate G is transferred between the second processing unit C and the exposing unit E through the interface portion D.

The loading/unloading unit A has a carrier stock portion 1 (as a cassette stock portion) and a conveying mechanism 2 (as a conveying means). The carrier stock portion 1 stocks a plurality of (for example, four) carrier cassettes C. Each carrier cassette 1 accommodates a plurality of glass substrates G as raw substrates. The conveying mechanism 2 transfers a glass substrate G accommodated in a carrier cassette C between the carrier stock portion 1 and the first processing unit B.

Each carrier cassette C is formed as a box that horizontally accommodates a plurality of glass substrates kept in parallel. The carrier cassette C holds each glass substrate G at peripheral portions (for example, four corners and a predetermined peripheral portion).

Figure 2:
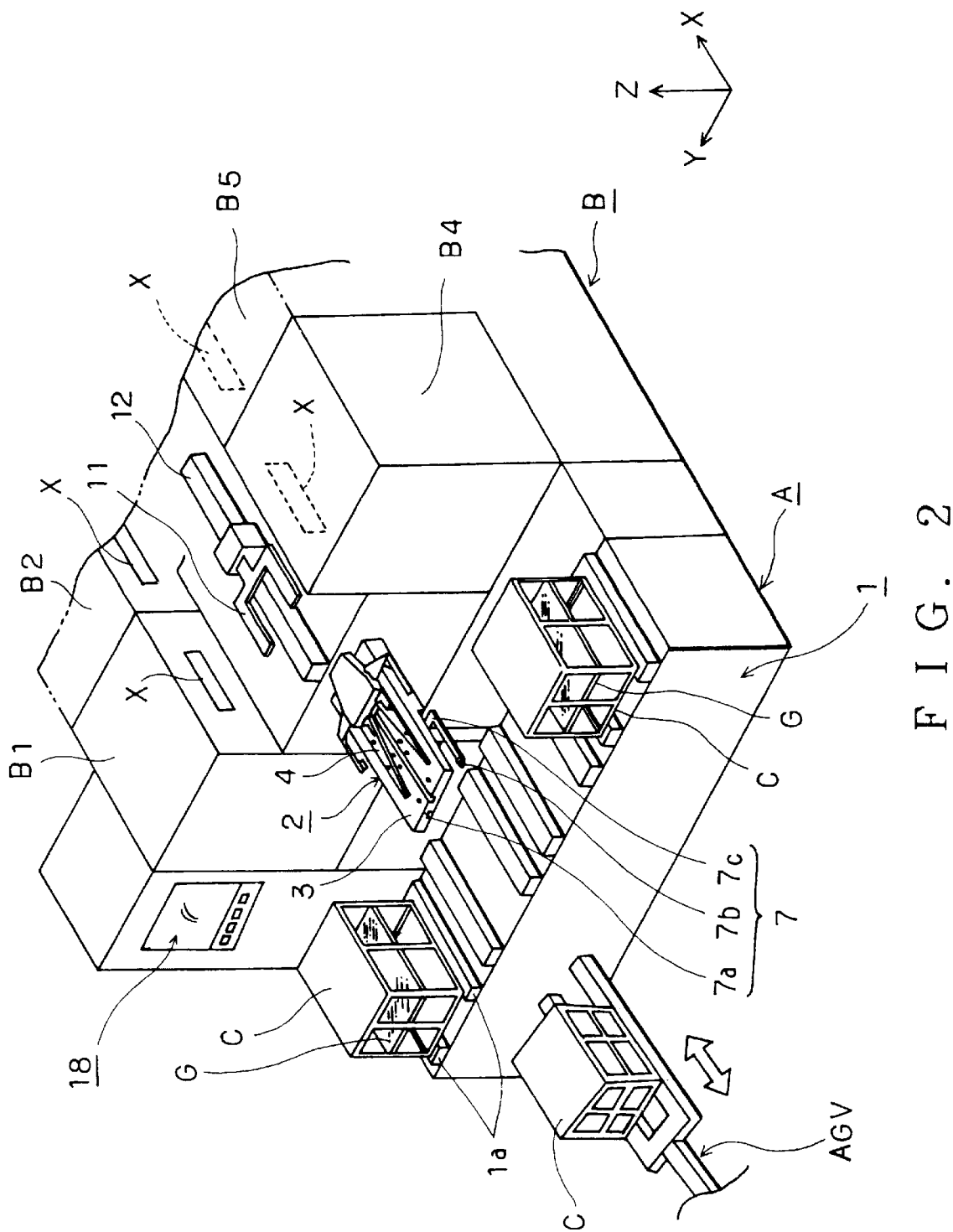
FIG. 2 is a perspective view showing an enlarged peripheral portion of a carrier cassette stock portion of the processing unit including the conveying unit according to the embodiment of the present invention.

FIG. 2 is a perspective view showing the structure of the loading/unloading unit A shown in FIG. 1.

The conveying mechanism 2 has a conveying main body 3. The conveying main body 3 can be traveled in Y, Z, and 2 directions. The conveying main body 3 has a pair of tweezers 4. The tweezers 4 can be traveled in X direction. The conveying mechanism 2 inserts the tweezers 4 into a carrier cassette C so as to load a glass substrate G to the carrier cassette C and unload a glass substrate G therefrom. When the conveying mechanism 2 loads/unloads a glass substrate G to/from a carrier cassette C, a controlling unit (that will be described later) should determine that glass substrates G are present at what stages of the carrier cassette C. To do that, the conveying mechanism 2 has a mapping sensor 7.

The mapping sensor 7 is composed of a light emitting/receiving portion 7a, an elongated mirror 7b, and a mapping sensor arm 7c. The light emitting/receiving portion 7a is disposed on the front surface of the conveying main body 3. The mirror 7b is fixedly disposed to the mapping sensor mirror arm 7c that can be traveled forward and backward. The mirror 7b reflects light emitted by the light emitting/receiving portion 7a thereto.

The conveying main body 3 scans the carrier cassette C from the highest stage to the lowest stage of the carrier cassette C. At a stage in which a glass substrate G is present, since the glass substrate G obstructs light emitted by the light emitting/receiving portion 7a, the mapping sensor 7 determines the presence of the glass substrate G.

Detection data of a glass substrate G detected by the mapping sensor 7 is supplied to a controlling means 18. The controlling means 18 calculates the thickness and/or flexure amount (particular data corresponding to the thickness of the glass substrate G) corresponding to the vertically traveling amount of the conveying main body 3 and a time period of which the optical path is obstructed.

The conveying mechanism 2 is traveled to a predetermined position opposite to a particular carrier cassette C. At the position, the conveying mechanism 2 performs the mapping operation (that will be described later). After identifiers (that will be described later) are assigned, the operation of the conveying mechanism 2 is controlled corresponding to the identifiers so as to successively extract glass substrates G from the carrier cassette C and transfer the extracted glass substrates G to a main arm 11 as a processing portion conveying mechanism of the first processing unit B. The main arm 11 conveys each glass substrate G to a plurality of processing portions of the first processing unit B (for example, a cleaning portion B1, an adhering portion B2, a cooling portion B3, a coating portion B4, and a heating portion B5). The processing portions coat a resist film on the front surface of each glass substrate G.

Next, with reference to FIG. 2, the operation of the loading/unloading unit A will be described.

An automatic conveying robot (also referred to as AGV: Automatic Guided Vehicle) conveys a carrier cassette C that accommodates a plurality of raw substrates from the outside of the unit to the carrier stock portion 1 as a cassette stock portion that stocks a plurality of carrier cassettes C. The AGV places the carrier cassette C on a stock table 1a of the carrier stock portion 1.

The carrier cassette C accommodates a plurality of glass substrates G with different thickness in such a manner that the glass substrates G are horizontally arranged and kept in parallel. The glass substrates G are extracted one after the other from an opening portion 20 on the front side of the carrier cassette C (see FIG. 3).

When the carrier cassette C is placed on the carrier stock table 1a, the conveying mechanism 2 is traveled. The conveying mechanism 2 is stopped at a position opposite to the front surface of one carrier cassette C. After performing the mapping operation, the conveying mechanism 2 extracts a glass substrate G from the carrier cassette C. The conveying mechanism 2 conveys the extracted glass substrate G to the substrate conveying main arm 11 of the first processing unit B. The substrate conveying main arm 11 travels to one of the processing portions B1 to B5 disposed on left and right sides of a conveying path 12. The substrate conveying main arm 11 transfers the glass substrate G to a relevant processing portion through a loading/unloading opening X of the processing portion B1 to B5.

Figure 3:
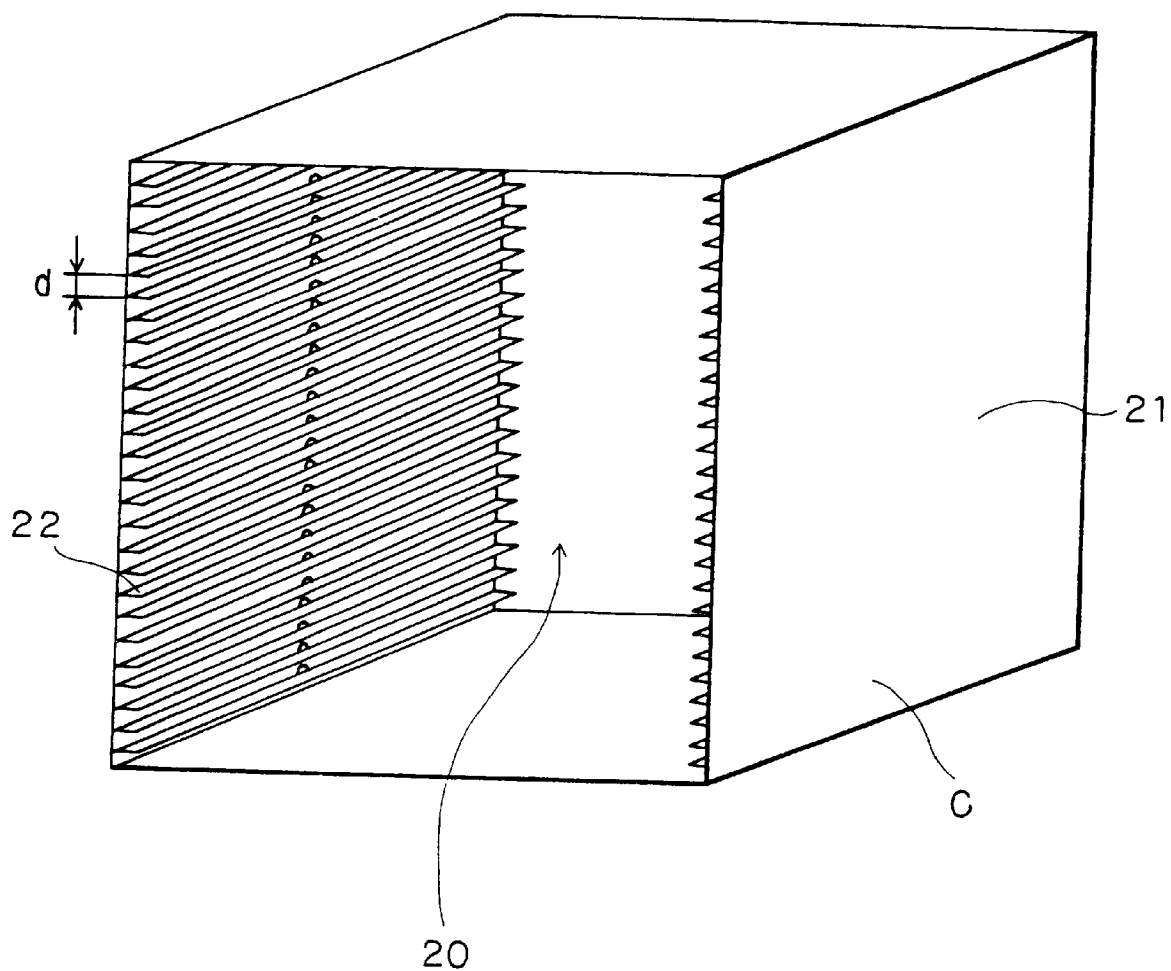
FIG. 3 is a perspective view showing the overall structure of a carrier cassette for use with the conveying unit according to the embodiment of the present invention.
Figure 4:
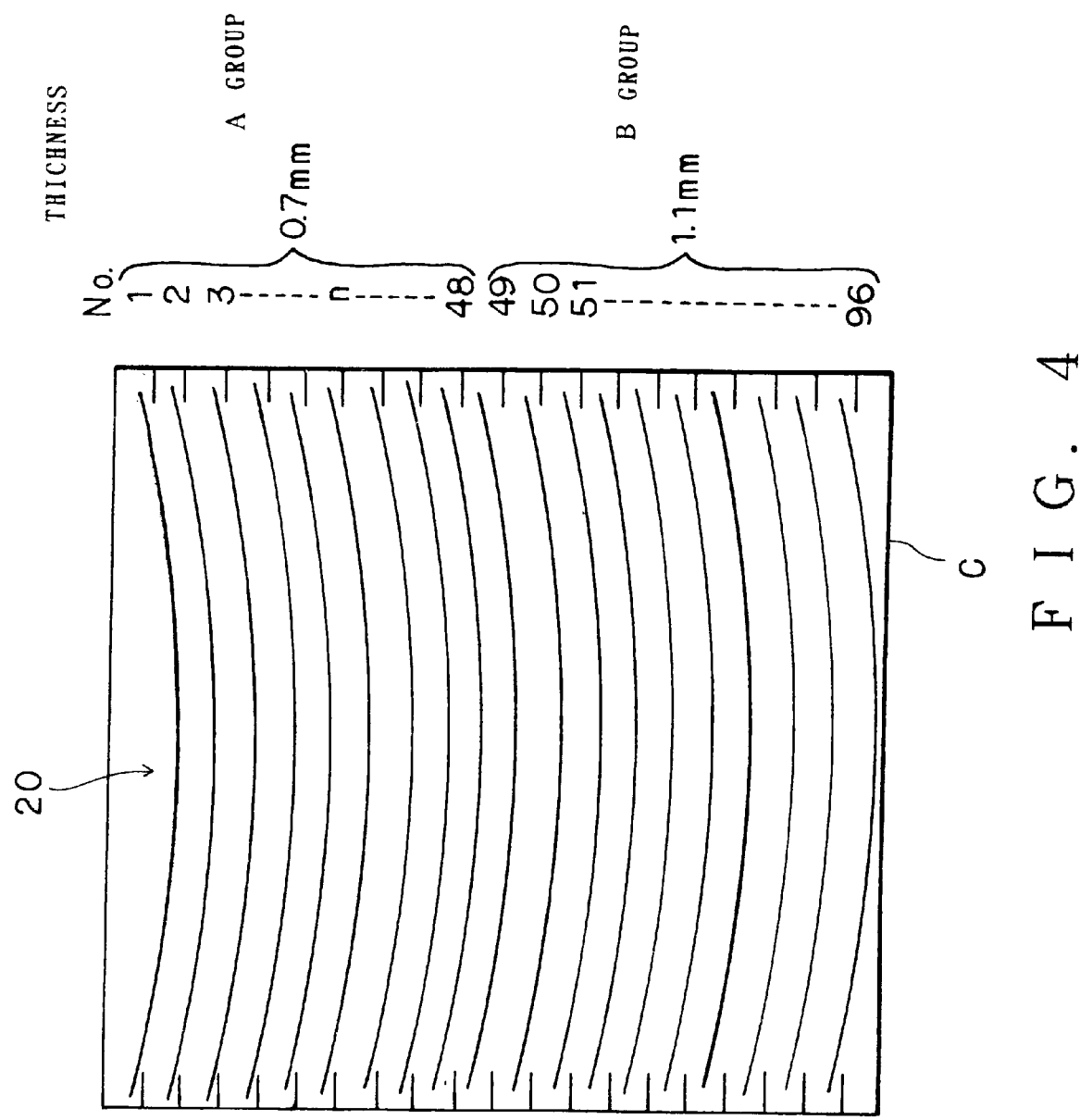
FIG. 4 is a front view showing the state that two types of glass substrates have been accommodated to a carrier cassette for use with the conveying unit according to the embodiment of the present invention.

FIG. 3 is a perspective view showing the structure of the carrier cassette C. FIG. 4 is a front view showing the structure of the carrier cassette C.

An opening portion 20 is formed at the front of the carrier cassette C. The carrier cassette C has a plurality of (for example, 96) holding members 22 formed at equal intervals d on left and right inner walls 21. Glass substrates G are fully inserted into the carrier cassette C in such a manner that the left and right peripheral edges of the glass substrates G are held with the holding members 22.

As shown in FIG. 4, the carrier cassette C accommodates a plurality of types of glass substrates with different thickness. For example, the carrier cassette C accommodates 48 glass substrates G whose thickness is 0.7 mm (these glass substrates are referred to as A group glass substrates) on upper stages and 48 glass substrates G whose thickness is 1.1 mm as (these glass substrates are referred to as B group glass substrates) on lower stages. The controlling unit that will be described later assigns recipe numbers 1 to 48 to the A group glass substrates G and recipe numbers 49 to 96 to the B group glass substrates G.

Figure 5:
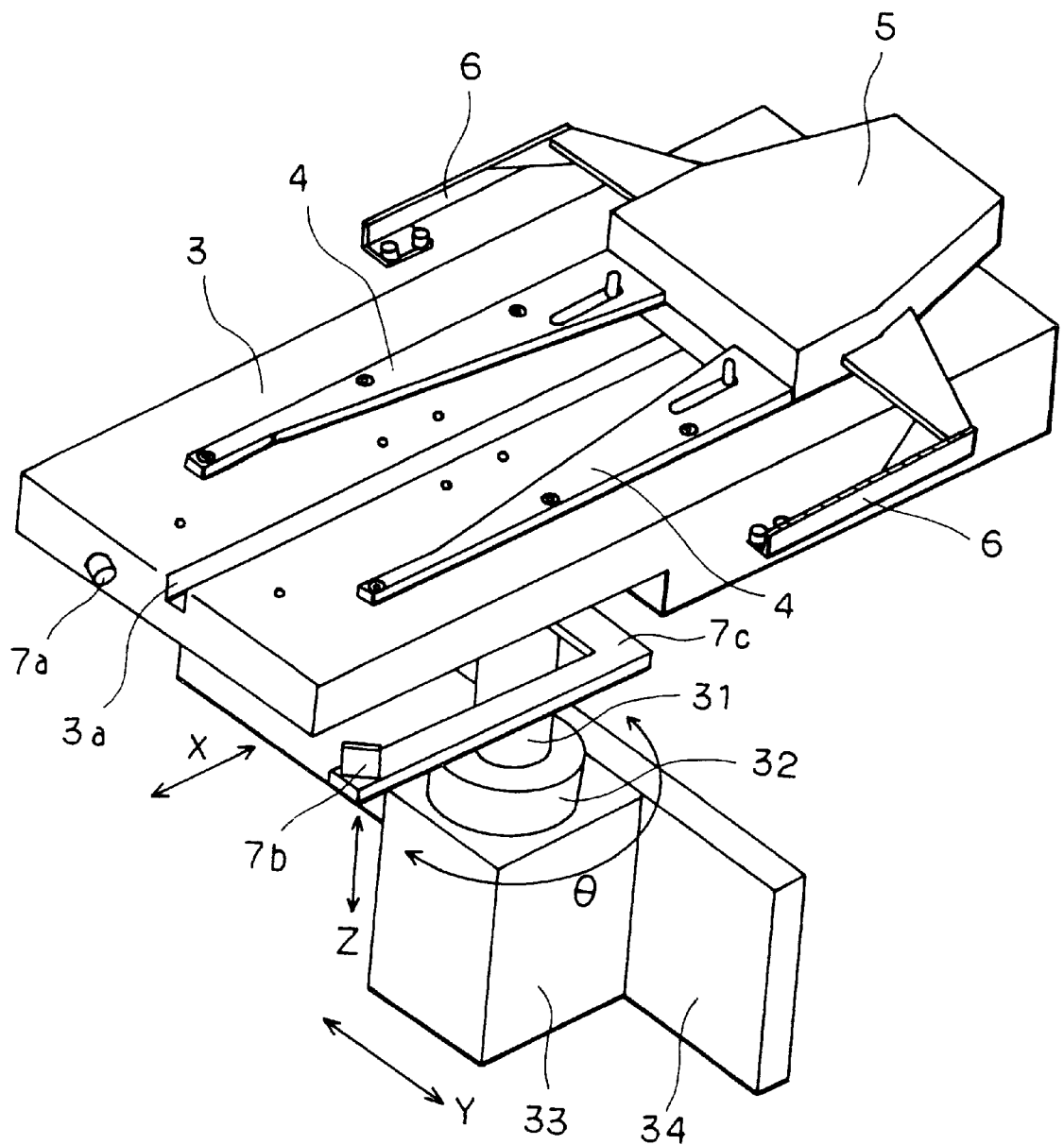
FIG. 5 is a perspective view showing the overall structure of the conveying unit according to the embodiment of the present invention.

FIG. 5 is a perspective view showing the structure of the conveying mechanism 2. FIG. 6 is a plan view showing the structure of the conveying mechanism 2.

The conveying main body 3 of the conveying mechanism 2 is held by a rotating shaft 31 and rotated by a motor 32 in 2 direction. The conveying main body 3, the rotating shaft 31, and the motor 32 are integrally raised and lowered in Z direction by a lifting portion 33. In addition, the conveying main body 3, the rotating shaft 31, and the motor 32 are integrally traveled in Y direction by a Y direction traveling mechanism 34.

A traveling member 5 is disposed in the conveying main body 3. The traveling member 5 is disposed to the front surface of the conveying main body 3. The traveling member 5 is traveled forward and backward in X direction along a traveling path 3a formed on the front surface of the conveying main body 3. The conveying member 5 is driven by for example a belt mechanism and a stepping motor disposed in the conveying main body 3.

The tweezers 4 are disposed at the front of the traveling member 5. The tweezers 4 upwardly pick up a glass substrate G accommodated in a carrier cassette C so as to load/unload the glass substrate G to/from the carrier cassette C.

Six sucking openings 13 are formed on the upper surface of the tweezers 4 so as to securely suck and hold a glass substrate G picked up from the carrier cassette C. The sucking openings 13 are connected to a vacuum pump VP through a valve V1 and pipes disposed in the tweezers 4. The valve V1 is opened and closed under the control of the controlling unit 18. A pair of arms 6 are disposed on both sides of the traveling member 5. The arms 6 extend from both the sides of the traveling member 5, bend at right angles, and extend along the longitudinal direction of the conveying main body 3. The arms 6 are reversely moved (in Y1 direction) by a driving mechanism (not shown) disposed in the traveling member 5.

Pressure rollers R are disposed at forward edge portions of the arms 6 so as to nip both peripheral edges of the glass substrate G in the carrier cassette C and preliminarily correct the position and orientation in Y direction of the glass substrate G.

Oval openings 14 are formed in the vicinity of bases of the tweezers 4. Alignment pins 15 are disposed in the openings 14. The alignment pins 15 are movable in X direction along the oval openings 14. The alignment pins 15 align the orientation and position in X direction of the glass substrate G placed on the tweezers 4 along with alignment pins 16 and lift pins 17 (that will be described later).

The alignment pins 16 are disposed on an extended line of the moving direction of the alignment pins 15 so that when the traveling member 5 that holds a glass substrate G (denoted by a two-dashed line shown in FIG. 6) with the tweezers 4 is placed in home position of the conveying main body 3, the alignment pins 16 are positioned outside (lower side in FIG. 6) the lower edge portion of the glass substrate G. These alignment pins 15 and 16 are protrusible in the vertical direction (namely, z direction) of the drawing shown in FIG. 6. When the glass substrate G is aligned, the alignment pins 15 and 16 protrude from the glass substrate G. In this state, the alignment pins 15 are moved in X direction. Thus, the glass substrate G is nipped by the alignment pins 15 and the alignment pins 16. Thus, the orientation and the position in X direction of the glass substrate G are corrected.

The lift pins 17 are protrusibly disposed at a nearly center position on the upper surface of the conveying main body 3. When the glass substrate G is aligned, the lift pins 17 raise the glass substrate G in Z direction. Thus, since the frictional drag to the upper surface of the tweezers 4 is alleviated, the glass substrate G can be easily aligned. In addition, the lift pins 17 prevents the lower surface of the glass substrate G from rubbing against the upper surface of the tweezers 4. Thus, the lower surface of the glass substrate G is prevented from being scratched.

Considering the lifting balance of the glass substrate G, when the traveling member 5 is placed in the home position of the conveying main body 3, the lift pins 17 are disposed nearly at the center of gravity of the glass substrate G.

When the coating and developing unit is installed, the positions of each carrier cassette C and the conveying mechanism 2 should be adjusted. Next, such an adjusting operation will be described.

Generally, when the coating and developing unit is installed, since the positions of each carrier cassette C and the conveying mechanism 2 vary, they should be adjusted.

When the coating and developing unit is fabricated, before it is shipped, the entire unit is assembled. A carrier cassette C that accommodates one type of glass substrates G (for example, 0.7 mm thick glass substrates G) is placed on the stock portion 1. The positions of the carrier cassette C and the conveying mechanism 2 are adjusted.

This operation is referred to as "positioning" operation. The positioning operation is performed in such a manner that the access position of which the tweezers 4 of the conveying mechanism 2 are inserted matches the center position of two adjacent glass substrates G accommodated in the carrier cassette C.

However, even if the positioning operation has been performed before the coating and developing unit is shipped, when the unit is installed on site, the relation between the positions of the carrier cassette C and the conveying mechanism 2 tends to vary.

Thus, to restore the relation between the positions of the carrier cassette C and the conveying mechanism 2 that has been adjusted before the unit had been shipped, the operation reference position of the conveying mechanism 2 is corrected as a corrected access position. The operation for setting the access position is referred to as "teaching" operation.

Figure 7:
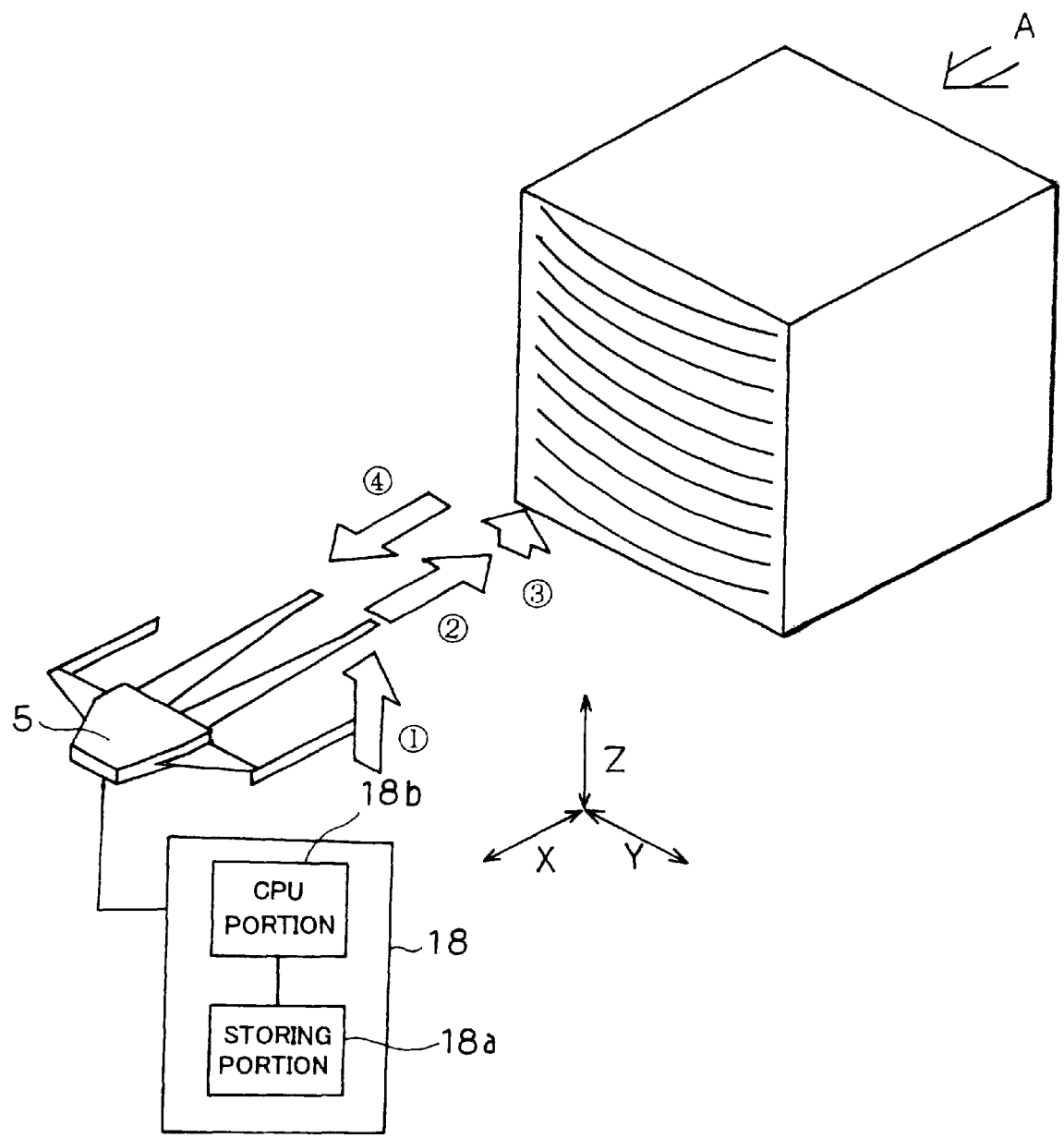
FIG. 7 is a schematic diagram showing the operation of the conveying unit according to the embodiment of the present invention.
Figure 9:
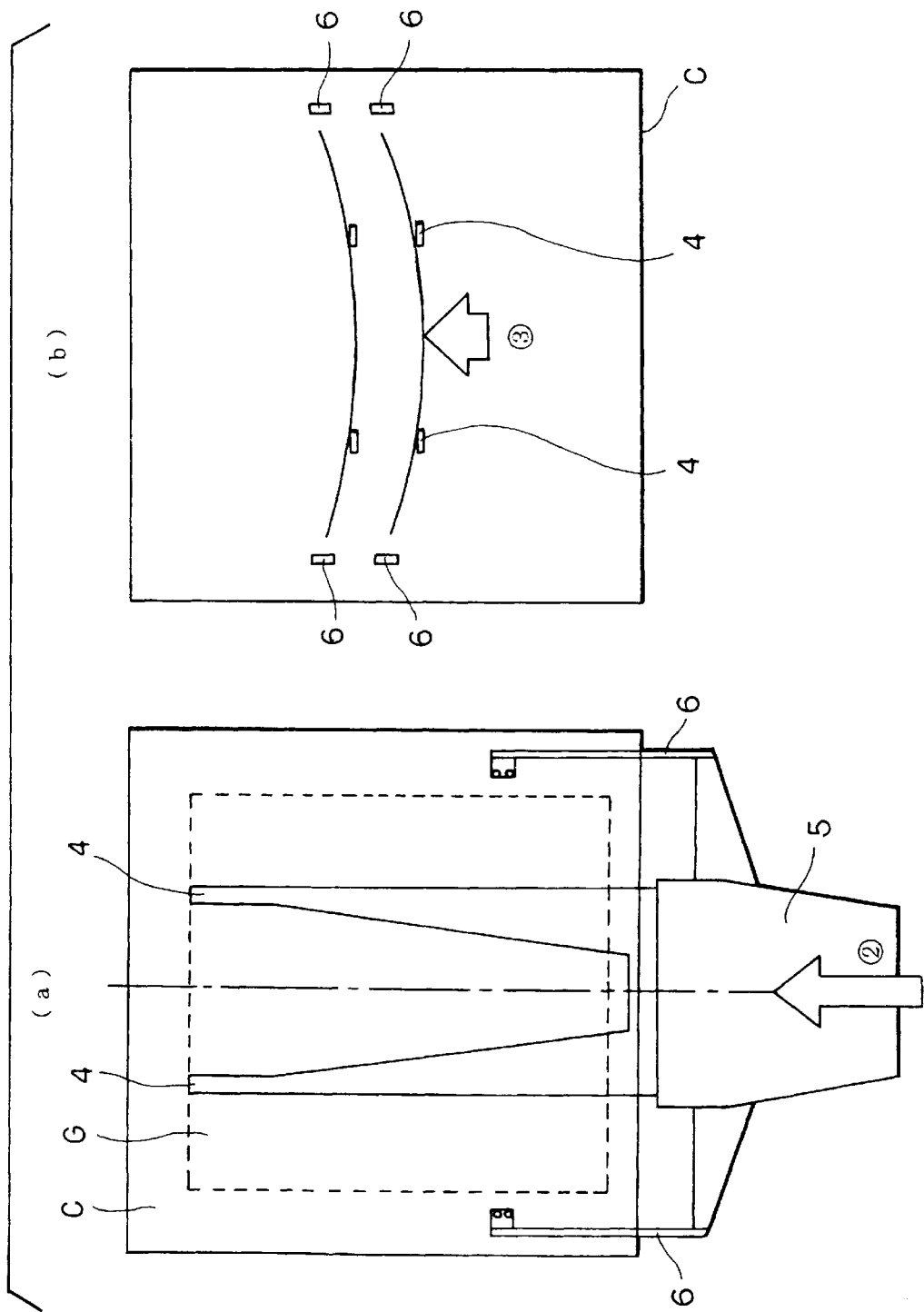
FIGS. 9A and 9B are schematic diagrams showing the operation of the conveying unit according to the embodiment of the present invention.
Figure 10:
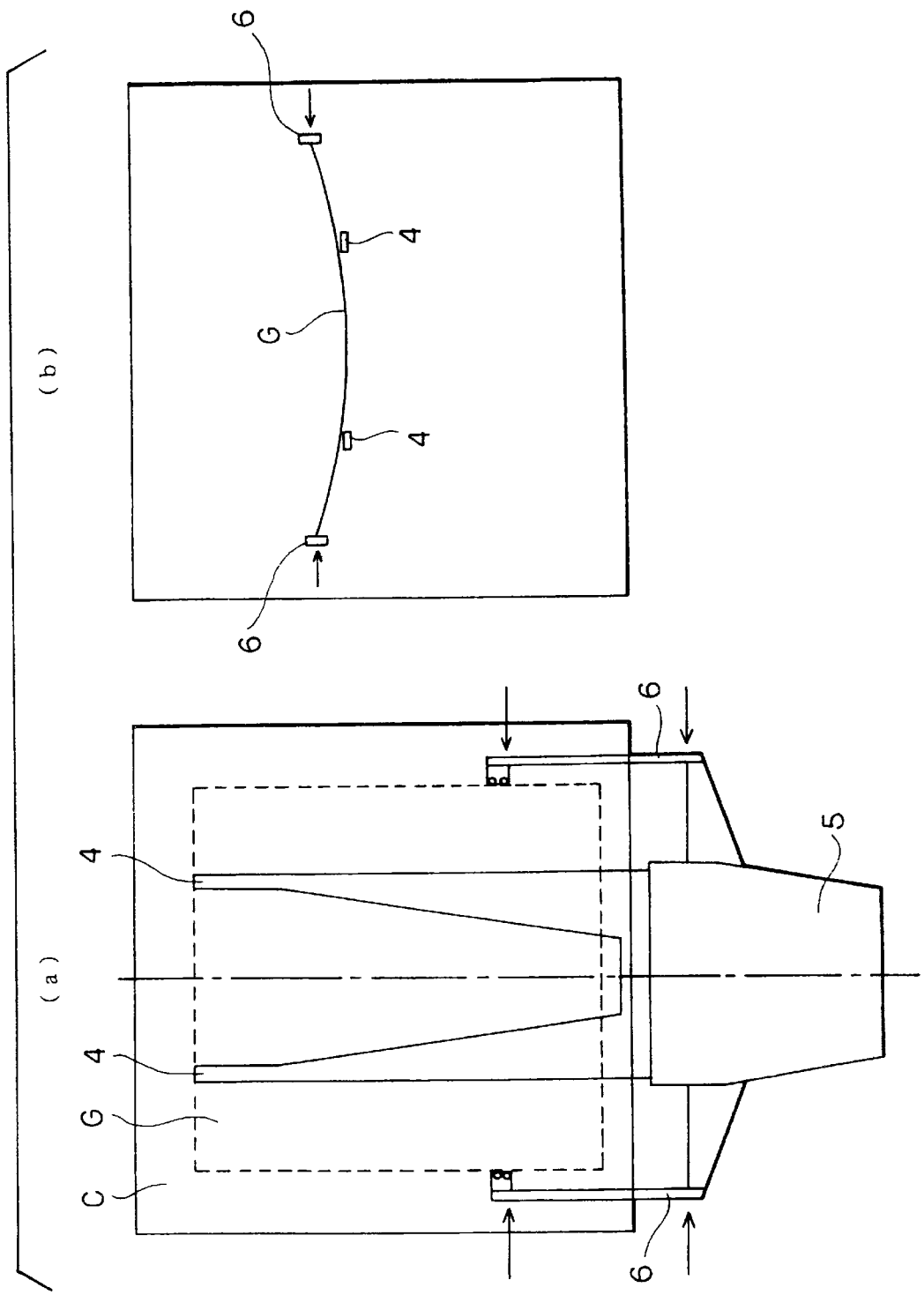
FIGS. 10A and 10B are schematic diagrams showing the operation of the conveying unit according to the embodiment of the present invention.
Figure 11:
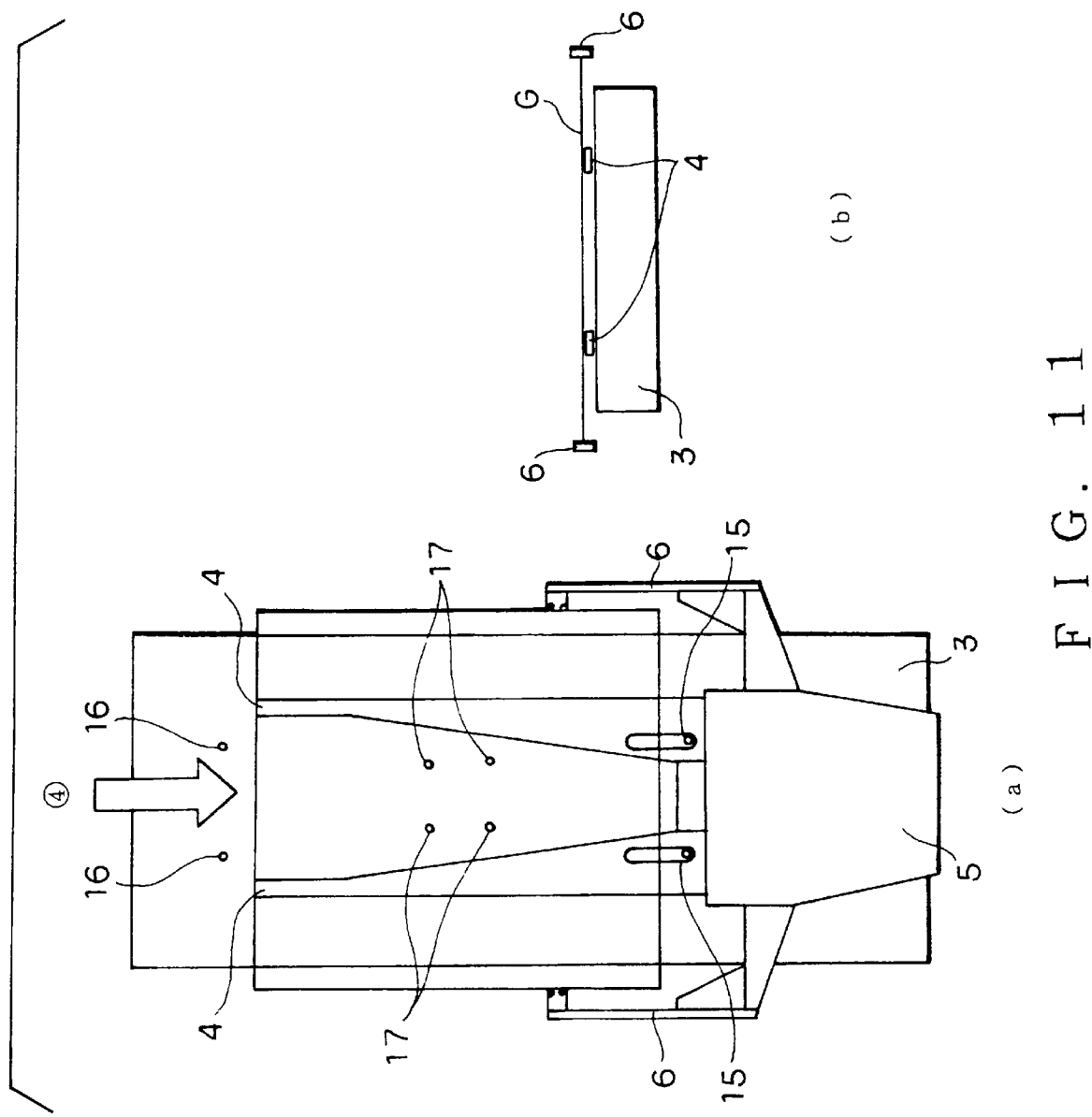
FIGS. 11A and 11B are schematic diagrams showing the operation of the conveying unit according to the embodiment of the present invention.
Figure 12:
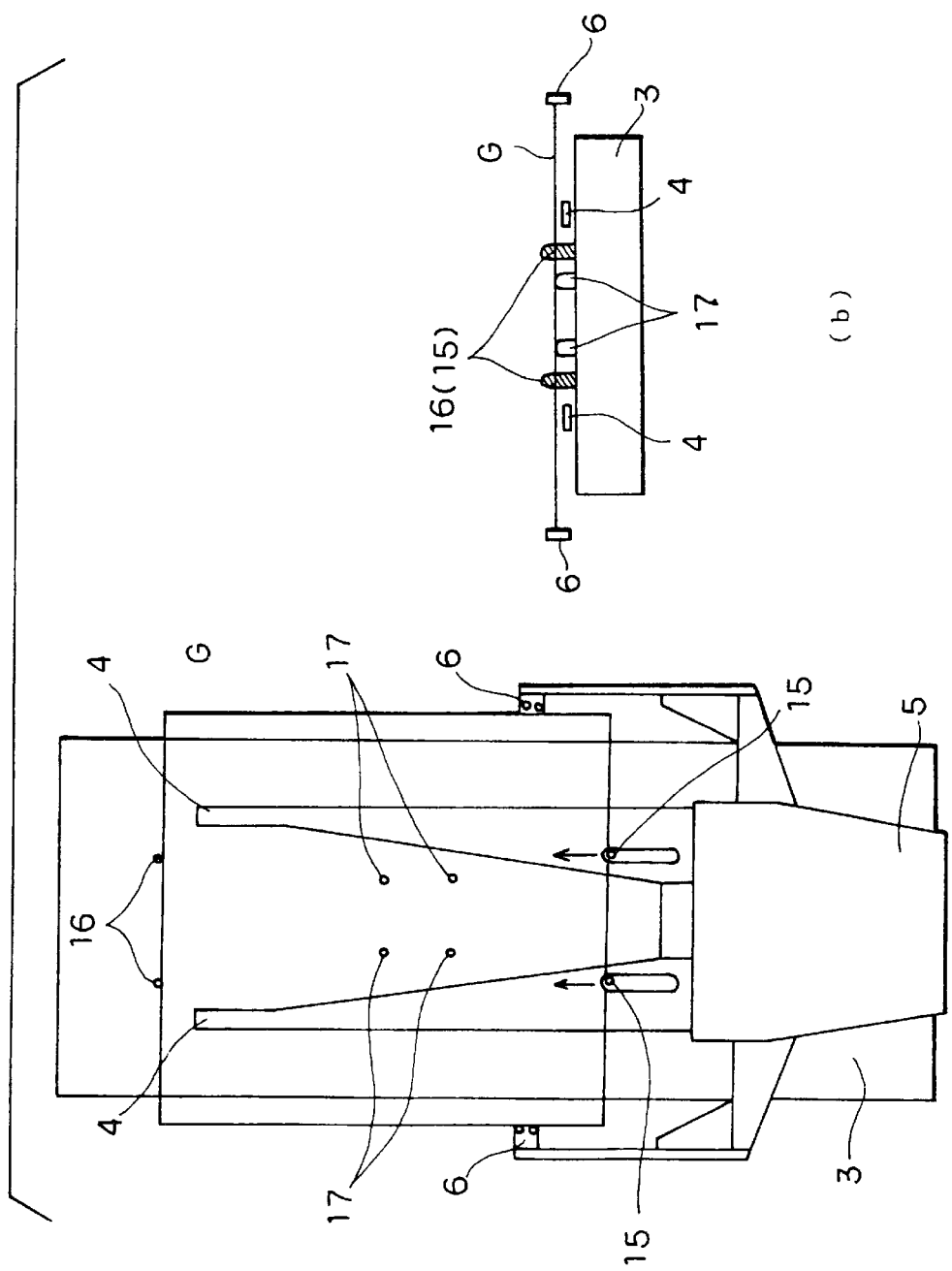
FIGS. 12A and 12B are schematic diagrams showing the operation of the conveying unit according to the embodiment of the present invention.

As a teaching method, when the unit is installed, if the relation between the positions of the conveying mechanism 2 and the carrier cassette C deviates, the traveling amount and traveling direction necessary for the operation reference position of the conveying mechanism 2 are input to the controlling unit 18 (see FIG. 7). The controlling unit 18 comprises a storing portion 18a and a CPU portion 18b as principal portions. The storing portion 18a is a storing medium such as a memory. The CPU portion 18b substantially controls the entire operations of the controlling portion 18.

For example, before the unit is shipped, the conveying mechanism is set so that it accesses the center position between two adjacent glass substrates G accommodated in a carrier cassette C. After the unit is installed, the access position of the conveying mechanism 2 upwardly deviates by 2 mm from the center position between two adjacent glass substrates G accommodated in the carrier cassette C.

In this case, since the operation reference position of the conveying mechanism 2 has upwardly deviated by 2 mm, a teaching operation is performed for the controlling unit 18 so that the operation reference position of the conveying mechanism 2 is downwardly shifted by 2 mm. Thus, since the conveying mechanism 2 operates with an offset of −2 mm against the operation reference position. Thus, the conveying mechanism 2 accesses the center position of two adjacent glass substrates G accommodated in the carrier cassette C.

On the other hand, data of the relation between the positions of the first group glass substrates G and the conveying mechanism 2 is calculated or measured. The obtained data is stored as compensation data to the storing portion 18a of the controlling unit 18. The access positions of the second ground glass substrates G are obtained corresponding to the access positions of the first group glass substrates G and the compensation data.

An access position C between a 0.7 mm thick glass substrate and a 1.1 mm thick glass substrate is obtained by the following formula as shown in FIG. 8.

$$C=(B-A)/2$$

where B represents the flexure amount of the 0.7 mm thick glass substrate; and A represents the flexure amount of the 1.1 mm thick glass substrate.

Next, the operation for unloading a glass substrate G from a carrier cassette C will be described.

FIG. 7 is a schematic diagram showing for explaining the unloading operation. FIGS. 9 to 12 are schematic diagrams showing operation states of individual portions.

When the conveying mechanism 2 receives a command from the controlling unit 18, the conveying mechanism 2 travels to a carrier cassette C on the carrier stock portion 1 and stops at a position opposite to the front surface of the carrier cassette C.

Next, the lifting unit 33 of the conveying mechanism 2 causes the conveying main body 3 to travel to the holding member 22 on the highest stage of the carrier cassette C. Thereafter, the conveying main body 3 extends the mapping sensor mirror arm 7c to a predetermined position and determines whether or not the light emitting/receiving portion 7a receives light emitted therefrom through the mirror 7b. The conveying main body 3 upwardly scans glass substrates G on the holding members 22 of the individual stages of the carrier cassette C.

While the conveying main body 3 is scanning glass substrates G from the lowest stage of the carrier cassette C to the highest stage thereof, the conveying main body 3 assigns recipe numbers as identifies to glass substrates G from the highest stage of the carrier cassette C to the lowest stage thereof. For example, the recipe number of the glass substrate G (1) held on the highest stage of the holding member 22 is denoted by No. 1. The recipe numbers are assigned from the highest stage of the carrier cassette C to the lowest stage thereof. The recipe number of a glass substrate G (96) held on the lowest stage of the holding member 22 is denoted by No. 96.

The recipe numbers (identifiers) are stored in the storing portion 18a of the controlling unit 18 of the coating and developing unit. The recipe numbers are correlated with the positions of the holding members 22 of the carrier cassette C. Thus, corresponding to a recipe number, it is determined what glass substrate G should be held with what holding members 22 of the carrier cassette C.

After the conveying main body 3 has scanned glass substrates G in the carrier cassette C and has assigned recipe numbers to the glass substrates C, the conveying main body 3 travels to the holding members 22 of the highest stage of the carrier cassette C, aligns the tweezers 4 with the glass substrate G (1) on the holding members 22 of the highest stage of the carrier cassette C, and unloads the glass substrate G (1) from the holding members 22 of the highest stage of the carrier cassette C.

When the conveying main body 3 extracts the glass substrate G (1) assigned the recipe number No. 1 from the first stage, the conveying main body 3 travels in Z direction and performs the aligning operation as denoted by FIG. 7(1). In other words, the conveying main body 3 causes the lifting unit 33 to operate so that the height of the tweezers 4 matches the height of the center position between the glass substrate G (1) on the highest stage and the glass substrate G (2) on the next stage.

Likewise, when the conveying main body 3 unloads the glass substrate G (n) on the n-th stage, the conveying main body 3 performs the aligning operation for the traveling member 5 as denoted by arrow (1) shown in FIG. 7. In other words, the conveying main body 3 causes the lifting unit 33 to operate so that the height of the tweezers 4 matches the height of the center position between the glass substrate G (n+1) and the glass substrate G (n). The height of the tweezers 4 for the first group glass substrates G assigned the recipe numbers 1 to 48 is obtained corresponding to the results of the teaching operation. In contrast, the height of the tweezers 4 for the second group glass substrates G assigned the recipe numbers 49 to 96 is obtained corresponding to the set data of the first group glass substrates G and compensation data. Thereafter, the traveling portion 5 is traveled in the direction denoted by arrow (2) shown in FIG.

7. The tweezers 4 are inserted into the space between the glass substrate G (n) and the glass substrate G (n+1) (see FIG. 9A). Thereafter, the traveling portion is traveled in the direction denoted by arrow (3) shown in FIG. 9B. Thus, the glass substrate G (n) is picked up by the tweezers 4 (see FIG. 9B). The height of the tweezers 4 that picks up a glass substrate G of the first group is obtained corresponding to the teaching operation. In contrast, the height of the tweezers 4 that picks up a glass substrate G of the second group is obtained corresponding to the set data of the first group glass substrates G and compensation data. In this state, the position and orientation in Y direction of the conveying mechanism 2 are pre-aligned (see FIG. 10). The traveling portion 5 is traveled in the direction denoted by arrow shown in FIG. 11A. Thus, the glass substrate G (n) is unloaded (see FIG. 11).

In this state, the position and orientation in X direction of the traveling portion 5 are aligned. After the position of the glass substrate G (n) (see FIG. 12) is determined. the glass substrate G (n) is fixed to the tweezers 4. The conveying mechanism 2 conveys the glass substrate to the main arm 11. In the conveying mechanism 2 according to the embodiment, the access positions of the second group glass substrates G are obtained corresponding to set data of the first group glass substrates G and compensation data. Thus, the teaching operation is performed only for the first group glass substrates G. Consequently, as with the coating and developing unit according to the embodiment, when a plurality of carrier cassettes C are disposed, the teaching operation can be simplified. Thus, the effects of the present invention are remarkable.

In addition, according to the embodiment, since recipe No. 1 to No. 48 are assigned to first group glass substrates G and recipe No. 49 to No. 96 are assigned to second group glass substrates G, the access positions can be controlled corresponding to the recipe Nos. Thus, even if one carrier cassette C accommodates a plurality of types of glass substrates G with different thickness, the glass substrates G can be smoothly unloaded from the carrier cassette C in a simple structure.

When one carrier cassette C accommodates one type of glass substrates G and another carrier cassette C accommodates another type of glass substrates, these glass substrates G can be smoothly unloaded from these carrier cassettes C.

When two or more types of glass substrates G with different thickness are accommodated in one carrier cassette C, after one type of glass substrates G are conveyed, another type of glass substrates G are unloaded. Alternatively, after one type of glass substrates G are unloaded, another type of glass substrates G are loaded. Thus, glass substrates G can be easily managed corresponding to each of types. Consequently, processing conditions of downstream processing units can be easily set and these processes can be smoothly performed.

It should be noted that the present invention is not limited to the above-described embodiment.

In the above-described embodiment, the difference of flexure amounts in the horizontal direction of one glass substrate is not mentioned. However, strictly speaking, the difference of flexure amounts should be considered. In other words, the flexure amount of a glass substrate G is the maximum at the center position thereof. The flexure amount is reversely proportional to the distance from the center position of the glass substrate G. In other words, the flexure amount of the glass substrate G in the vicinity of the holding members 22 of the carrier cassette C is the minimum. Normally, the flexure amount of the glass substrate G in the access position of the tweezers 4 is smaller than the maximum value. Thus, when the access position of the tweezers 4 is controlled, the flexure amount of the glass substrate G at the access position of the tweezers 4 should be considered.

In the above-described embodiment, two types of glass substrates G with thickness of 0.7 mm and 1.1 mm are considered. However, the present invention is not limited to such an example. In other words, glass substrates G with thickness of 1.1 mm and 0.5 mm may be used. Alternatively, three types of glass substrates G with different thickness may be used. As a further alternative example, a plurality of types of glass substrates G with different hardness may be used. In such cases, the access positions of the glass substrates can be obtained corresponding to compensation data for each type of glass substrates G. In other words, in such examples, when the teaching operation is performed for one type of glass substrates G, it is not necessary to perform the teaching operation for other types of glass substrates G.

In addition, according to the above-described embodiment, the teaching operation is manually performed for the A group glass substrates G. Alternatively, the flexure amounts of the glass substrates G can be automatically detected with the sensor 7 of the conveying mechanism 2.

Since the sensor 7 can detect the height at a particular position of a glass substrate G accommodated in a carrier cassette C, the overall flexure amount of the glass substrate G can be obtained corresponding to the following known formula (1).

$$y = px(1-x)(l^2 + lx - x^2)/24EI \quad (1)$$

where y represents the flexure amount; p represents the equally distributed load; l represents the length of beam; x represents the distance from the edge portion; E represents the Young's modulus; and I represents the sectional secondary moment.

In the above-described embodiment, an example of which a glass substrate G is transferred between a carrier cassette C disposed on a stock table of a processing unit and the conveying mechanism 2 was described. Alternatively, the present invention can be applied to an example of which a glass substrate is transferred between the processing unit B and a buffer cassette C of the interface portion D disposed between the processing unit B and the exposing unit or between the processing unit B and the exposing unit.

In addition, the present invention can be applied to silicon wafers transferred to their processing unit rather than the above-described LCD glass substrates G.

Figure 13:
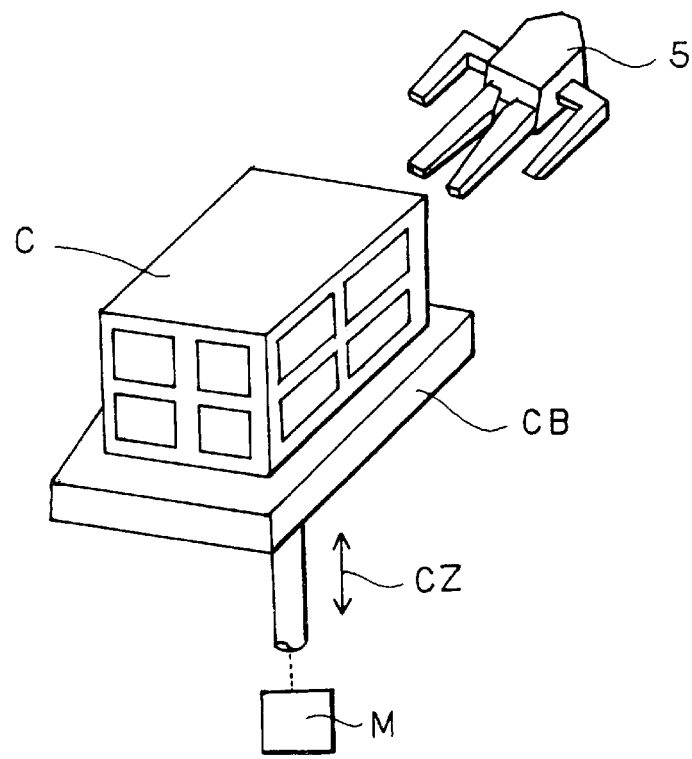
FIG. 13 is a perspective view showing the operation of the conveying unit according to the embodiment of the present invention.

In the above-described embodiment, the vertical traveling amount of the conveying mechanism 2 is adjusted so as to transfer a glass substrate G to a carrier cassette C. Alternatively, as shown in FIG. 13, a stock table CB that stocks a carrier cassette C may be traveled by the traveling amount in vertical direction CZ by a driving mechanism such as a stepping motor M rather than the conveying mechanism 2. As a further alternative example, the stock table CB and the conveying mechanism 2 may be traveled in different vertical directions so as to shorten the conveying time. In this case, the throughput can be improved.

Figure 14:
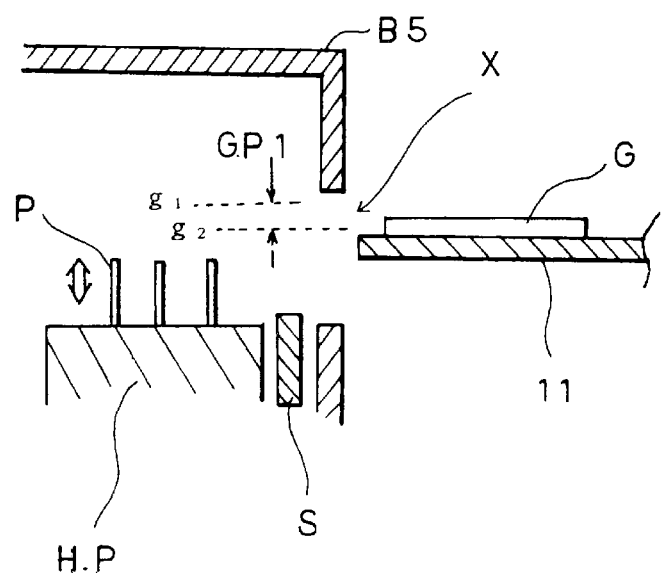
FIG. 14 is a schematic diagram showing the operation of a processing portion according to the embodiment of the present invention.

Next, an example of a processing unit according to the embodiment of the present invention will be described. The processing unit processes a substrate. As described above, since a type or the thickness of a glass substrate accommodated in a carrier cassette G can be detected, the above-described embodiment can be applied as follows. First, an example of which the above-described embodiment is applied to the heating portion B5 of the processing portions B1 to B5 shown in FIG. 1 will be described. As shown in FIG. 14, for example a hot plate HP as a heating member is disposed in the heating portion B5. The hot plate HP performs a heating process for a glass substrate G. A transferring mechanism is disposed on the hot plate HP. The transferring mechanism protrusibly holds a glass substrate G and transfers it between the hot plate HP and the main arm 11. The transferring mechanism is composed of a plurality of holding pins P. The heating portion B5 has an entrance X with a shutter S. Thus, the entrance X of the heating portion B5 is closed with the shutter S. The main arm 11 loads a glass substrate G to the heating portion B5. It is assumed that glass substrates with thickness of 1.1 mm and 0.5 mm are present and that the height of the loading position is the same as the height of the unloading position. In addition, it is assumed that both types of glass substrates G are processed in the same process time (namely, the conveying time of one type of glass substrates G is the same as the conveying time of the other type of glass substrates G). In this case, 0.5 mm thick glass substrates G are more affected by heat radiated by the hot plate HP than 1.1 mm thick glass substrates G. Thus, a 0.5 mm thick glass substrate G is preferably loaded and unloaded at height g1 that is larger than height g2 at which a 1.1 mm thick glass substrate is loaded and unloaded. The vertical position of a glass substrate G loaded to the processing portion is controlled by the controlling mechanism 18. In other words, the controlling mechanism 18 controls the holding pins P and the main arm 11 corresponding to data stored in the 20 storing portion 18a. In this example, the height of the conveying position was described. Alternatively, the conveying time rather than the height of the conveying position may be varied. In other words, the controlling mechanism 18 may control the holding pins P and the main arm 11 so that the conveying time for a 0.5 mm thick glass substrate G is shorter than the conveying time for a 1.1 mm thick glass substrate G.

Figure 15:
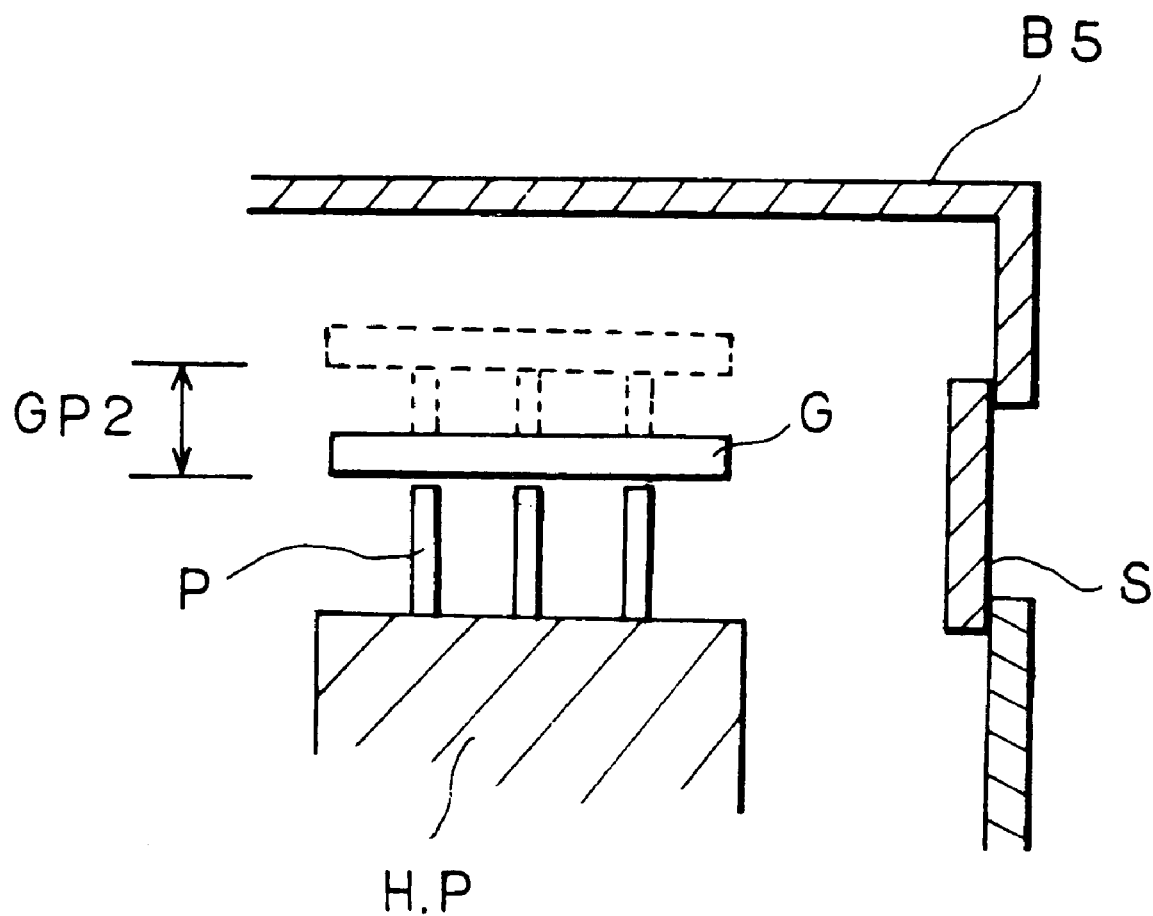
FIG. 15 is a schematic diagram showing the operation of the processing portion according to the embodiment of the present invention.

In addition, as shown in FIG. 15, in the heating portion B5, when a heating process is performed for a glass substrate G spaced apart from the hot plate HP, a 0.5 mm thick glass substrate G is processed at a higher position than a 1.1 mm thick glass substrate G by GP2. In this case, the deviation due to the difference of the thickness of glass substrates G can be suppressed. In addition to the height adjustment, the process time may be adjusted. In other words, when the process time of a 0.5 mm thick glass substrate G is shorter than the process time of a 1.1 mm thick glass substrate G, the deviation of the heating process due to the difference of thickness of glass substrates G can be suppressed. When processing conditions are controlled corresponding to data stored in the storing portion 18a of the controlling mechanism 18, the yield of the glass substrates G can be improved.

Figure 16:
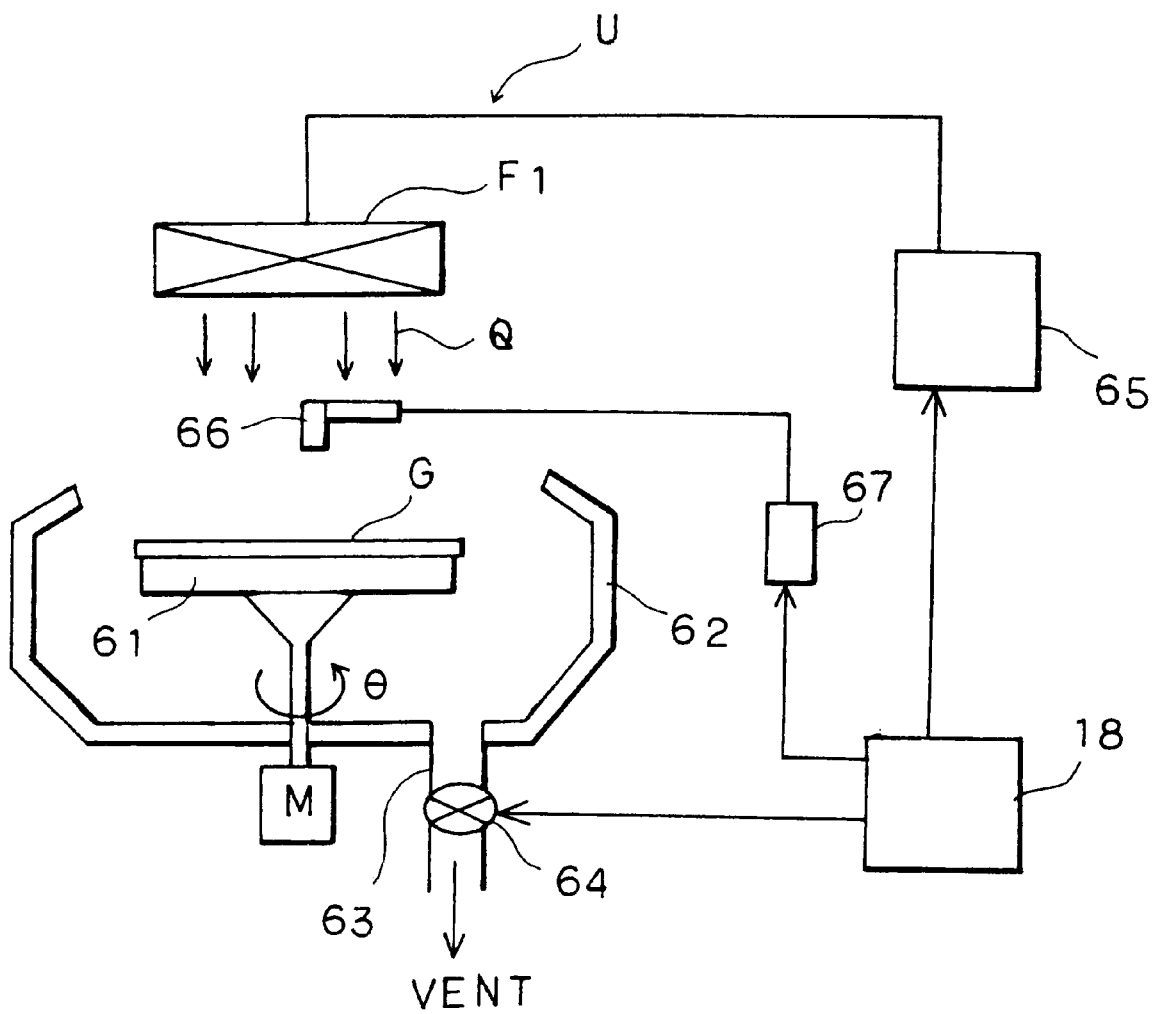
FIG. 16 is a schematic diagram showing the operation of the processing portion according to the embodiment of the present invention.
Figure 17:
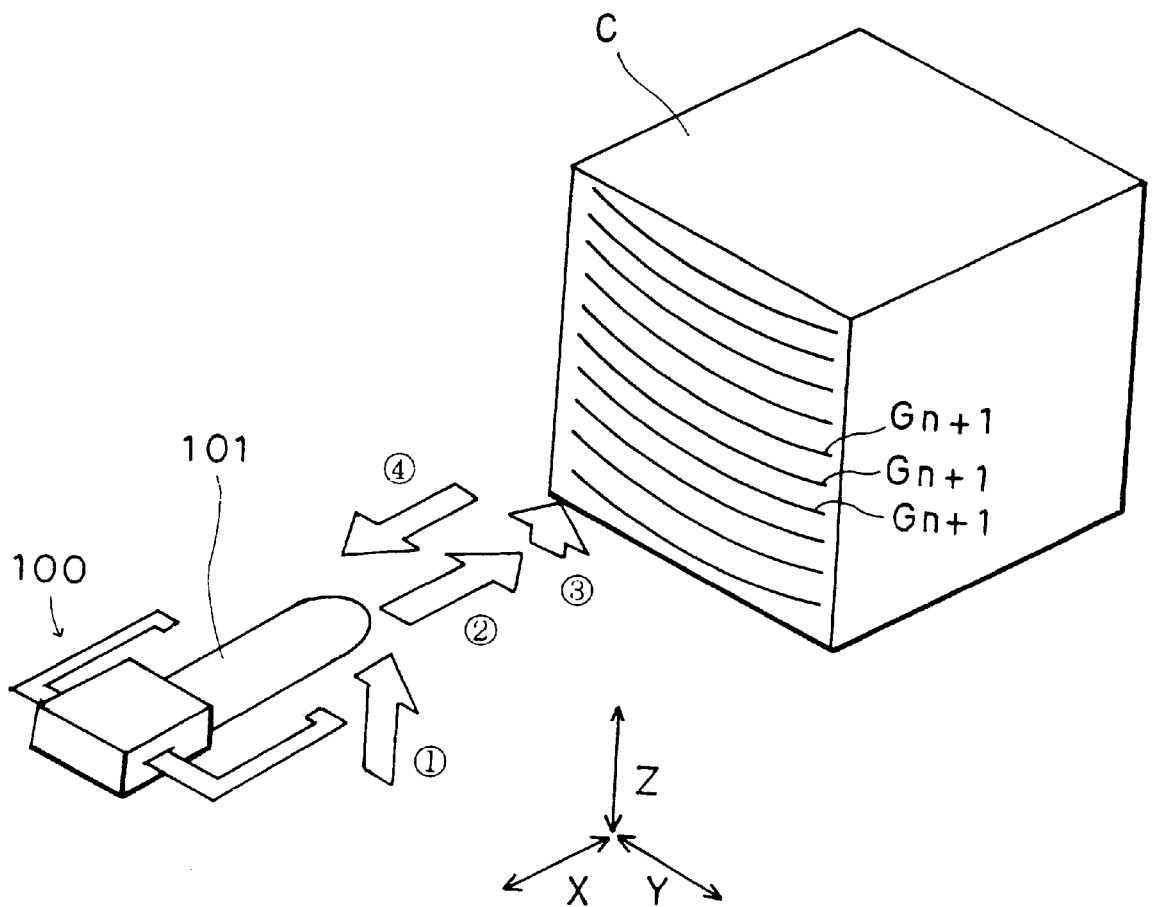
FIG. 17 is a perspective view showing the relation between a conventional conveying mechanism and a carrier cassette.

Next, the coating portion B4 as a rotating solution processing portion of the processing portions B1 to B5 will be described. As shown in FIG. 16, the coating portion B4 has a spin chuck 61 as a rotating mechanism that holds a glass substrate G. The spin chuck 61 is rotated by a driving mechanism M such as a motor. A cup 62 as a liquid splash protecting member is disposed around the spin chuck 61. The cup 62 suppresses and prevents processing solution for example resist solution from splashing. A gas exhaust path 63 is disposed at a lower position of the spin chuck 61. The gas exhaust path 63 exhausts gas from a processing chamber to the outside. A gas exhaust amount adjusting mechanism (for example, a butterfly valve 64) is disposed in the middle of the gas exhaust path 63. The butterfly valve 64 exhausts gas from the processing chamber at a predetermined gas exhaust rate. The butterfly valve 64 operates corresponding to a command received from the controlling mechanism 18. An atmospheric gas adjusting mechanism U is disposed at an upper position of the spin chuck 61. The atmospheric gas adjusting mechanism U controls atmospheric gas received from a temperature/humidity adjusting mechanism 65 through a filter F1 at a desired flow rate. The temperature/humidity adjusting mechanism 65 adjusts the temperature and/or humidity of the processing chamber. The temperature/humidity adjusting mechanism 65 of the atmospheric gas adjusting mechanism U operates corresponding to a command received from the controlling mechanism 18. A nozzle 66 of a solution supplying mechanism 67 is disposed between the filter F1 of the atmospheric gas adjusting mechanism U and the spin chuck 61. The solution supplying mechanism 67 supplies a desired amount of processing solution (for example, resist solution) to the processing surface of a glass substrate G held on the spin chuck 61. The solution supplying mechanism 67 operates corresponding to a command received from the controlling mechanism 18.

Next, an example of a controlling operation for processing conditions of the coating portion B4 will be described. The processing conditions of the coating portion B4 are controlled with data of various types of glass substrates G with different thickness. The data is stored in the storing portion 18a of the controlling mechanism 18.

The controlling mechanism 18 designates and controls at least one of the rotating speed of the spin chuck 61, the spray amount of a processing solution supplied from the solution supplying mechanism 67, the temperature and/or humidity or the flow rate of the atmospheric gas adjusting mechanism U, and the gas exhaust amount of the gas exhaust amount adjusting mechanism.

When the rotating speed of the spin chuck 61 is controlled, in the case that other processing conditions are not varied, it is preferred that the rotating speed of a 0.5 mm thick glass substrate G is lower than the rotating speed of a 1.1 mm thick glass substrate G. Due to the influence of an air current in the vicinity of the periphery of a glass substrate G, the temperature of the periphery of a 0.5 mm thick glass substrate G is lower than the temperature of the periphery of a 1.1 mm thick glass substrate G. Thus, the temperature distribution on the processing surface of a 0.5 mm thick glass substrate G is larger than that of a 1.1 mm thick glass substrate G. To solve such a problem, the gas exhausting amount of the gas exhausting adjusting mechanism may be decreased. Alternatively, at least one of the temperature and humidity of the atmospheric gas adjusting mechanism U may be varied (for example, one of the temperature and humidity may be raised). As another alternative example, the flow rate of the atmospheric gas adjusting mechanism U may be decreased. As a further alternative example, a plurality of factors may be used in combination.

In addition, by varying the spray amount of the processing solution received from the solution supplying mechanism 67, the deviation of the process due to the difference of temperature distributions of glass substrates G can be suppressed. In other words, as described above, due to an air current, the temperature of the periphery of a 0.5 mm thick glass substrate is lower than that of a 1.1 mm thick glass substrate. Thus, when resist solution does not spread out to the periphery of a glass substrate or a problem takes place on the periphery, the spray amount of the resist solution can be increased.

When one carrier cassette C accommodates two or more types of glass substrates with different thickness, the processing conditions may be designated for each glass substrate G. However, it is preferred that after one type of glass substrates G are processed, another type of glass substrates G are processed. In this case, the processing conditions are set for the number of types of glass substrates. Thus, the processing efficiency is improved. In addition, one type of glass substrates that have been processed are loaded to one carrier cassette C or another carrier cassette C. Consequently, types of glass substrates can be easily managed. As a result, processing conditions can be easily set and resultant glass substrates can be smoothly processed.

It should be noted that the present invention is not limited to the above-described embodiment.

For example, in the above-described embodiment, as processing solution, resist solution was mentioned. Instead, the processing solution may be developing solution, pure water, or volatile solution. In addition, as raw substrates, glass substrates G were considered. Instead, the raw substrates may be semiconductor wafers or the like.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A conveyor unit, comprising:
   a cassette stock portion for stocking a plurality of accommodating cassettes, each of the accommodating cassettes horizontally accommodating a plurality of raw substrates;
   a conveyor that horizontally loads and unloads each of the raw substrates to and from one of the accommodating cassettes; and
   a controller that separates the plurality of raw substrates into a plurality of groups corresponding to a thickness of the raw substrates, assigns identifiers to the raw substrates corresponding to the groups, and conveys each of the raw substrates corresponding to the identifiers or controls a vertical traveling amount of each of the accommodating cassettes.

2. The conveyor unit as set forth in claim 1, wherein the conveyor unit selects and conveys each of the raw substrates corresponding to each of the plurality of the groups.

3. The conveyor unit as set forth in claim 1, wherein said conveyor mechanism has a detector that detects one of a flexure amount and the thickness of each of the raw substrates.

4. The conveyor unit as set forth in claim 1,
   wherein said conveyor mechanism increases or decreases the vertical traveling amount corresponding to the thickness or a flexure amount of each of the raw substrates.

5. The conveyor unit as set forth in claim 1, wherein the conveyor selects each of the raw substrates corresponding to each of the plurality of groups, successively unloads the raw substrates, and loads the raw substrates to each of the accommodating cassettes.

6. A conveyor unit, comprising:
   a cassette stock portion that accommodates a cassette, the cassette horizontally accommodates a plurality of raw substrates;
   a conveyor mechanism that horizontally loads and unloads each of the raw substrates to and from the cassette;
   a memory that stores the relative relation of loading/unloading positions of raw materials; and
   a controller that sets the loading/unloading position of at least one of the substrates and determines the relative position of any remaining substrates in the cassette;
   wherein the controller issues instructions to said conveyor to convey each of the raw substrates or controlling a vertical traveling amount of the cassette corresponding to the loading/unloading position of the at least one substrate and the relative position any remaining substrates.

7. The conveyor unit as set forth in claim 6, wherein said controller sets and determines the loading/unloading position so that said conveyor mechanism loads and unloads each of the raw substrates at a height of a center position of a space vertically formed between two adjacent raw substrates.

8. The conveyor unit as set forth in claim 7, wherein said controller defines the height of the center position of the space vertically formed between the two adjacent raw substrates corresponding to an average value of flexure amounts of these raw substrates when the raw substrates are different.

9. A conveyor unit, comprising:
   a cassette stock portion that accommodates a cassette, the cassette horizontally accommodating a plurality of raw substrates;
   a conveyor mechanism for horizontally loading and unloading each of the raw substrates to and from the cassette;
   a calculator that calculates a flexure amount of each of the raw substrates accommodated in the cassette; and
   a controller that determines the loading/unloading position of each of the raw substrates corresponding to calculated results from said calculator; wherein
   the controller issues instructions to said conveyor to convey each of the raw substrates or controlling a vertical traveling amount of the cassette corresponding to the determined results of said controller.

10. The conveyor unit as set forth in claim 9, further comprising;

a detector that determines the flexure amount at a predetermined position of each of the raw substrates accommodated in the cassette, wherein the flexure amount of each of the raw substrates accommodated in the cassette is the flexure amount in the loading/unloading position of said conveyor mechanism to each of the raw substrates accommodated in the cassette corresponding to the detected flexure amount at the predetermined position.

11. The conveyor unit as set forth in claim 10, wherein said detector determines the presence of each of the raw substrates accommodated in the cassette.

12. A substrate, processor, comprising:

a plurality of processors that set vertical positions of raw substrates and process the raw substrates;

a cassette stock portion the accommodates a cassette, the cassette horizontally accommodating a plurality of raw substrate;

a conveyor mechanism that horizontally loads and unloads each of the raw substrates to and from the cassette;

a processor conveyer that receives each of the raw substrates through said conveyor mechanism and conveys each of the raw substrates to each of the plurality of processors;

a detector that determines a thickness and/or a flexure amount of each of the raw substrates accommodated in the cassette and detects the number and positions of the raw substrates accommodated in the cassette; and a controller that controls at least one of a loading/unloading position of each of the raw substrates to and from the cassette by said conveyor mechanism, the loading/unloading position of each of the raw substrates to each of the processors by the processor conveyor, a processing position of each of the raw substrates processed in each of the processors, a process time of each of the raw substrates processed in each of the processors, a gas exhaust amount in each of the processors in which each of the raw substrates is placed, a spray amount of a processing solution supplied to each of the raw substrates, and atmospheric gas reacted with each of the raw substrates corresponding to detected results of said detector so as to set and control a vertical direction of each of the raw substrates and/or control processing conditions of each of the raw substrates.

13. The substrate processor as set forth in claim 12, wherein when the cassette accommodates a plurality of raw substrates with different thickness and/or flexure amounts, said conveyor mechanism unloads the raw substrates from the cassette and/or each of the processors processes the raw substrates.

14. The substrate processor as set forth in claim 12, wherein one of the processors heats each of the raw substrates, and wherein the process time of the heat processor is proportional to the thickness of each of the raw substrates.

15. The substrate processor as set forth in claim 12, wherein one of the processor heats each of the raw substrates, and wherein the distance of the processing position of each of the raw substrates to a heating member in the heating processor is reversely proportional to the thickness of each of the raw substrates.

16. The substrate processor as set forth in claim 12, wherein one of the processors rotates the raw substrate and performs a solution process for each of the raw substrates, and wherein the gas exhaust amount of the process is proportional to the thickness of each of the raw substrates.

17. The substrate processor as set forth in claim 12, wherein one of the processors heats each of the raw substrates, and wherein the vertical position of each of the raw substrates loaded to the heating processor is reversely proportional to the thickness of each of the raw substrates.

18. The substrate processor as set forth in claim 12, wherein temperature, humidity, and flow rate of atmospheric gas reacted with each of the raw substrates are controlled corresponding to the detected results.

19. The substrate processor as set forth in claim 12, wherein the spray amount of processing solution supplied to each of the raw substrates is set corresponding to the detected results.

* * * * *